(12) United States Patent
Young et al.

(10) Patent No.: US 6,218,864 B1
(45) Date of Patent: Apr. 17, 2001

(54) STRUCTURE AND METHOD FOR GENERATING A CLOCK ENABLE SIGNAL IN A PLD

(75) Inventors: Steven P. Young, San Jose; Jane W. Sowards, Fremont; Wilson K. Yee, Pleasanton, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/370,854

(22) Filed: Aug. 10, 1999

(51) Int. Cl.$^7$ .................................................. H03K 19/096

(52) U.S. Cl. .................................. 326/93; 326/38; 326/31

(58) Field of Search .............................. 326/37, 38, 39, 326/40, 41, 93, 95, 98

(56) References Cited

U.S. PATENT DOCUMENTS

| | | | |
|---|---|---|---|
| 5,731,715 | * | 3/1998 | Mote, Jr. .................................. 326/93 |
| 5,808,486 | * | 9/1998 | Smiley ..................................... 327/34 |
| 5,986,470 | * | 11/1999 | Cliff et al. ............................... 326/41 |
| 6,021,501 | * | 2/2000 | Shay ....................................... 327/291 |

OTHER PUBLICATIONS

"PCI Local Bus Specification", PCI Special Interest Group, Revision 2.2, Dec. 18, 1998.

* cited by examiner

Primary Examiner—Michael Tokar
Assistant Examiner—Don Phu Le
(74) Attorney, Agent, or Firm—Lois D. Cartier

(57) ABSTRACT

The invention provides a structure and method of generating a clock enable signal in a programmable logic device (PLD). A first embodiment of the invention comprises a clock enable circuit implemented such that the critical paths have only two levels of logic. In this embodiment, the critical paths are implemented in dedicated logic while other portions of the clock enable circuit are implemented using programmable logic. According to another embodiment of the invention, the clock enable circuit is located near the center of a first edge of the device. A first plurality of output registers are located along the first edge on either side of the clock enable circuit, with additional output registers being located along the two adjacent half-edges. Programmable interconnection points (PIPs) permit a clock enable interconnect line along the first edge to be programmably extended to the additional output registers. In another embodiment, the clock enable circuit is duplicated in two opposite edges of the device.

22 Claims, 3 Drawing Sheets

STRUCTURE AND METHOD FOR GENERATING A CLOCK ENABLE SIGNAL IN A PLD

CROSS-REFERENCE TO RELATED APPLICATIONS

This application relates to the following commonly assigned co-pending U.S. patent application: Ser. No. 09/321,513 invented by Andrew K. Percey, Trevor J. Bauer, and Steven P. Young entitled "Input/Output Interconnect Circuit for FPGAs", which is incorporated herein by reference.

FIELD OF THE INVENTION

The invention relates to programmable logic devices (PLDs). More particularly, the invention relates to a structure and method for generating a clock enable signal for a PLD.

BACKGROUND OF THE INVENTION

It is necessary for integrated circuits (ICs), including programmable logic device (PLDs), to communicate according to established protocols. For example, when two or more ICs drive a single bit of a bus, only one IC can be allowed to provide the signal at a given time. If a single bus line is driven both high and low at the same time, then the line may assume an intermediate state, thereby producing both unpredictable logical results and an undesirable power drain at the signal destination. Further, if a data signal and a clock signal are both provided from a first IC to a second IC, the two signals must be provided at known relative times, to avoid latching the wrong data.

To avoid such situations, and to allow ICs from various manufacturers to communicate with each other, various standards have been developed specifying required input/output behavior at IC pins. Systems employing such a standard typically can include only devices adhering to the standard. Therefore, the ability to meet such a standard is a strong commercial advantage.

One such standard is the PCI standard. PCI is an open, non-proprietary local bus standard offering high performance for multiple peripheral devices. The standard is becoming widely accepted throughout the computer industry. A complete PCI Revision 2.2 specification is available from PCI Special Interest Group, P.O. Box 14070, Portland, Oreg. 97214, and is incorporated herein by reference. PCI works as a processor-independent bridge between a CPU and high-speed peripherals and allows PCI cards built today to be used in many different systems. In essence, the PCI standard specifies a standard data bus width, address bus width, and control signals to control a standardized set of commands implemented by the standard, e.g., read, write, and so forth. Also specified are the required timing relationships among all of these signals.

FIG. 1 shows a small part of a known circuit implementing the PCI standard (a "PCI circuit"). As shown in FIG. 1, the control signals for the PCI circuit include a tristate signal T for tristatable output buffers OBUF, as well as a data input signal I, a clock signal CK, and a Clock Enable signal PCI_CE for output registers OUTFF in which the output data is stored. (In the present specification, the same reference characters are used to refer to terminals, signal lines, and their corresponding signals. In the figures, input/output structures are shown as boxes including "X"s. These boxes represent buffered input/output pads such as are well known in the art.) A maximum data bus width of 64 bits mandates provision for 64 data input signals I, 64 data output registers OUTFF, and 64 data output buffers OBUF. Clock enable signal PCI_CE is not supplied at an input pad; instead it is internally generated from two externally supplied signals specified by the PCI standard: initiator ready ($I_{RDY}$) and target ready ($T_{RDY}$). The logical and timing interrelationships between signals $I_{RDY}$ and $T_{RDY}$ are dictated by the PCI standard. A PCI circuit also includes other signals (not shown) requiring additional input/output pads, buffers, output registers and other circuitry. Some of the additional output registers are also driven by clock enable signal PCI_CE.

The PCI standard supports two different rates of data transfer, 33 MHz (megahertz) and 66 MHz, and two different data bus widths, 32 bits and 64 bits. (The data bus width of 32 or 64 bits is typically used to identify the specific standard, although the bus implemented by the standard includes additional control signals and is therefore wider than the numerical designator.) Even the 33 MHz data rate is difficult to achieve with a 64-bit data bus, and the 66 MHz data rate is available in very few available devices at this writing. The standard is even more difficult to meet when attempting to implement a PCI circuit in a programmable logic device (PLD) such as a field programmable gate array (FPGA). A difficult requirement to meet for the 66 MHz/64-bit standard is a 6 ns (nanosecond) maximum allowable clock-to-out delay for the output register. In other words, the delay from the time the clock signal CK is available at the clock input pad to the time the output signal appears on the output pad O can be no more than 6 ns. In order to meet this timing requirement, the output register OUTFF must be located at or near the output pad O. Even so, typically several nanoseconds are consumed between the output register and the output pad. In one PLD, the Virtex™ device from Xilinx, Inc., the data transfer from output register to output pad requires 3 ns. Therefore, only 3 ns are available to provide the clock signal CK from the clock input pad to the output register. This timing is normally achievable using known methods (e.g., global clock networks).

However, the clock enable signal PCI_CE must be present at the output register OUTFF prior to the arrival of the clock CK. Therefore, the clock enable signal PCI_CE has less than 3 ns to reach the output register. Fortunately, the $I_{RDY}$ and $T_{RDY}$ signals have a setup time of 3 ns at the input pads. Therefore, there is a total of less than 6 ns available between the arrival of $I_{RDY}$ and $T_{RDY}$ at the input pads and the PCI_CE signal arriving at the output register.

As previously described (and as shown in FIG. 1), the clock enable signal PCI_CE does not come directly from a buffered pad. Instead, the clock enable signal is generated on-chip from the two signals $I_{RDY}$ and $T_{RDY}$. Therefore, some internal logic ("CE Logic" in FIG. 1) is of necessity included in the clock enable path. Further, the clock enable signal PCI_CE is very heavily loaded. The PCI standard for the 64-bit bus specifies 64 data output registers driven by this signal, and there are typically several other output registers driven by PCI_CE (e.g., 13) required to implement the standard in the FPGA. Therefore, the clock enable signal PCI_CE has a fanout of more than 64. Consequently, the 3 ns $I_{RDY}$ and $T_{RDY}$ setup requirement is very difficult to meet. In particular, this requirement is difficult to meet when implementing the 64-bit, 66 MHz PCI standard in programmable logic devices, using the available programmable logic resources.

It is desirable to provide a structure and method for supplying a PCI clock enable signal from the signals $I_{RDY}$ and $T_{RDY}$ to the clock enable pins of output registers in less than the time specified by the PCI standard. It is yet further desirable to provide a similar structure and method for use in PLDs adhering to other standards.

SUMMARY OF THE INVENTION

The invention provides a structure and method of generating an internal clock enable signal in a programmable logic device (PLD). A first embodiment of the invention comprises a clock enable circuit implemented such that the critical paths between the $I_{RDY}$ and $T_{RDY}$ signals and the PCI_CE signal have only two levels of logic. In this embodiment, the critical paths are implemented in dedicated logic while other portions of the clock enable circuit are implemented using programmable logic. This mixture of dedicated and programmable logic allows the critical path requirements to be met while allowing less critical portions of the clock enable circuit to be implemented using standard logic blocks. When the same PLD is used to implement a non-PCI-compliant circuit, these logic blocks can be used for other purposes. Thus, the combination of dedicated and programmable circuitry enables the highly efficient use of device resources for all circuits, while allowing the implementation when required of circuits meeting or exceeding the very high PCI standard.

According to another embodiment of the invention, the clock enable circuit is located near the center of a first edge of the device. This location has the advantages of balancing the skew on the clock enable signal and minimizing the delay from the clock enable circuit to the farthest output register. A first plurality of output registers are located along the first edge on either side of the clock enable circuit. A first clock enable interconnect line extends along the first edge adjacent to the output registers. Additional output registers are located along the two adjacent half-edges of the device, with two clock enable interconnect lines paralleling the two adjacent half-edges. Programmable interconnection points (PIPs) permit the clock enable interconnect line along the first edge to be programmably coupled to the two adjacent clock enable interconnect lines. This capability of, so to speak, "programmably extending the clock enable interconnect line around the corners" has two advantages. Firstly, when only the output registers along the first edge are used, the loading on the clock enable interconnect line is reduced, thereby speeding up this critical signal. Secondly, this technique allows the clock enable circuit of the invention to be used on a device or package too small to have sufficient output registers along a single edge.

In another embodiment, the clock enable circuit is duplicated in the centers of two opposite edges of the device. This arrangement allows the device to be mounted in a package in either the "face up" or "face down" position. Further, this arrangement works well in accommodating the pin locations recommended as part of the PCI standard. Additionally, two independent PCI interfaces can be simultaneously implemented in a single device.

In one embodiment, the clock enable interconnect lines along the left and right edges of an FPGA are dedicated to the PCI_CE signal. However, the clock enable interconnect lines along the top and bottom of the FPGA are implemented using general interconnect resources. For example, in one embodiment the bi-directional hex lines described in U.S. patent application Ser. No. 09/321,513 are used to form the top and bottom clock enable interconnect lines. Therefore, the horizontal clock enable lines can be extended in segments spanning 12 output registers (6 input/output blocks).

In another embodiment, a programmable delay element is included in the clock enable circuit. Using the programmable delay element, the clock enable signal edge can be adjusted with respect to the clock signal edge so that it falls within the setup and hold time "window" for each output register in the PLD. This aspect of the invention allows the same clock enable circuit to be used in PLDs of widely varying sizes. In one embodiment, the programmable delay element is mask programmable.

BRIEF DESCRIPTION OF THE DRAWINGS

The present invention is illustrated by way of example, and not by way of limitation, in the following figures, in which like reference numerals refer to similar elements.

Figure 1:
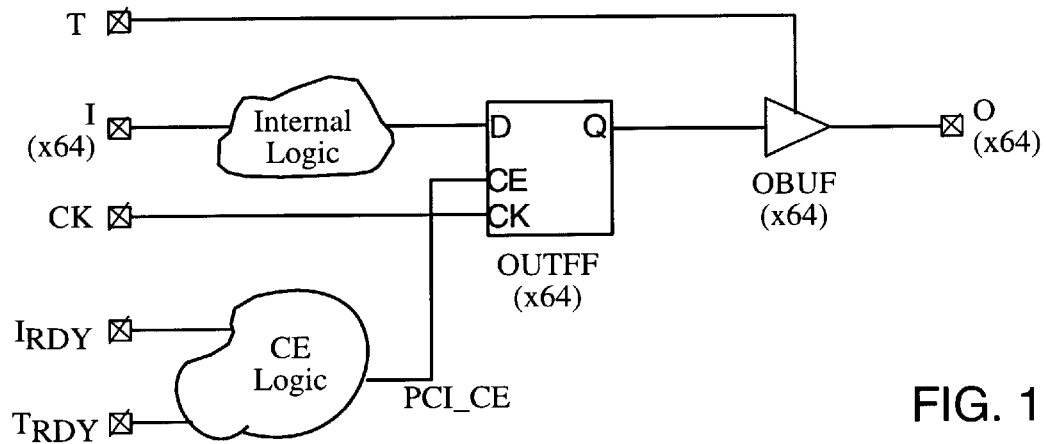
FIG. 1 shows a known prior art structure for passing PCI data signals through an output register.

While the invention is susceptible to various modifications and alternative forms, specific embodiments thereof are shown by way of example in the drawings and are described herein in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 2:
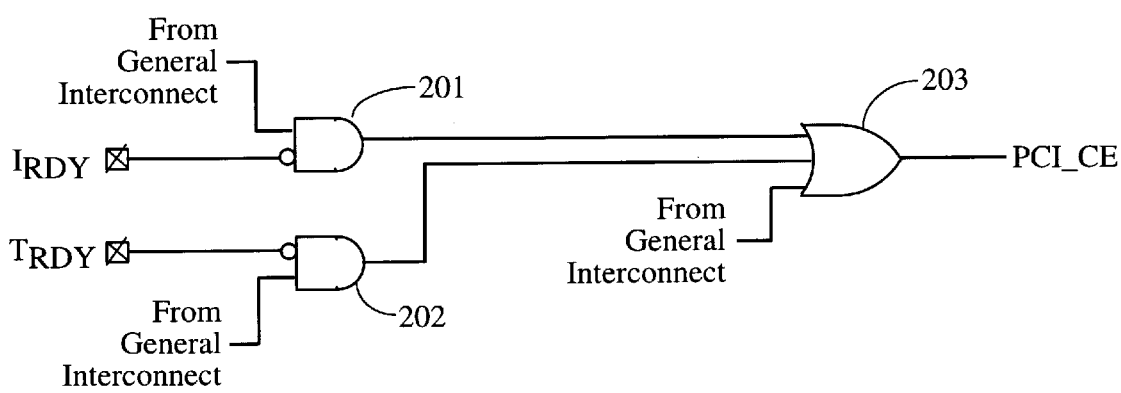
FIG. 2 shows a clock enable circuit according to one embodiment of the invention.

FIG. 2 shows a clock enable circuit according to one embodiment of the invention. Additional logic (not shown) is also used when generating a PCI circuit according to the PCI standard. This logic is easily generated by those of ordinary skill in the relevant arts, therefore it is not shown in FIG. 2, for clarity. The additional logic is preferably implemented in programmable logic gates available in a logic array in the PLD. Signals coming from the additional logic are labeled in FIG. 2 as "From General Interconnect".

The clock enable circuit of FIG. 2 includes first and second AND-gates 201, 202 and 3-input OR-gate 203. A buffered input pad provides the initiator ready signal $I_{RDY}$. The inversion of initiator ready signal $I_{RDY}$ is ANDed in AND-gate 201 with a signal from the general interconnect structure, preferably provided by the internal logic array. Thus, the origin of the signal is selectable by the user when programming the PLD, along with the additional logic described above. AND-gate 201 drives OR-gate 203, which provides the PCI clock enable signal PCI_CE.

Similarly to the initiator ready input signal $I_{RDY}$, the target ready signal $T_{RDY}$ is provided by a buffered input pad. The inversion of target ready signal $T_{RDY}$ is ANDed in AND-gate 202 with a signal from the general interconnect structure, preferably provided by the internal logic array. AND-gate 202 also drives OR-gate 203, which provides the PCI clock enable signal PCI_CE.

The third input signal for OR-gate 203 comes from the general interconnect structure, preferably provided by the internal logic array.

By looking at FIG. 2, it is easily seen that the path from either of input signals $I_{RDY}$ and $T_{RDY}$ to the clock enable signal PCI_CE comprises only two gate delays, the delay through one AND-gate (203 or 204) plus the delay through OR-gate 203. In one embodiment, the gates shown in FIG. 2 are implemented in equivalent CMOS logic comprising two NOR-gates and a NAND-gate. As is well-known to those of ordinary skill in the relevant arts, the clock enable signal itself is preferably buffered one or more times as it is distributed about the PLD. However, the delay engendered by generating the logic clock enable signal comprises only two gate delays. Note that the delay through the internal logic array has been removed from the critical paths between the input signals $I_{RDY}$ and $T_{RDY}$ and the clock enable signal PCI_CE.

Figure 3:
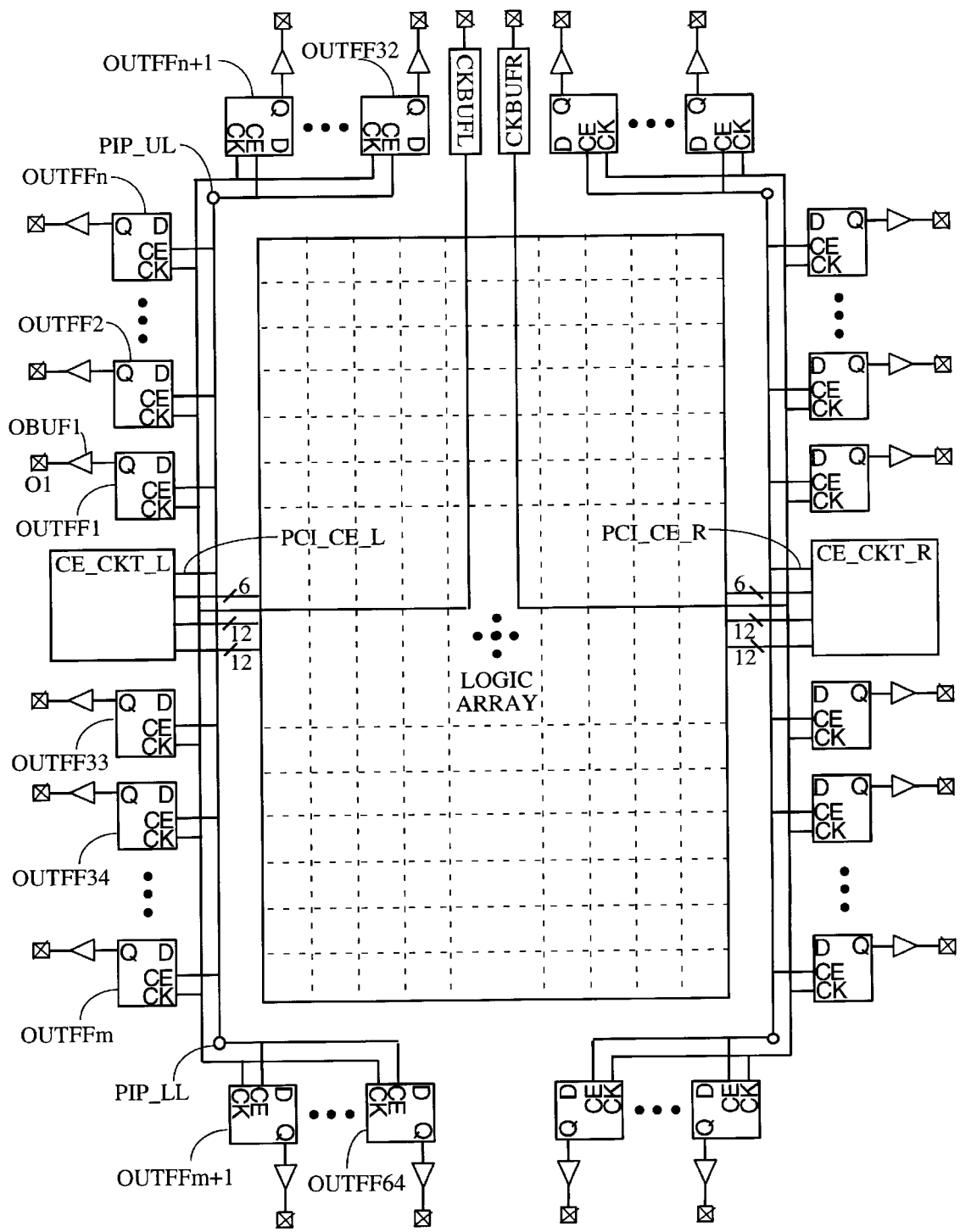
FIG. 3 shows a PLD with two clock enable circuits arranged according to another embodiment of the invention.

FIG. 3 shows a PLD with two clock enable circuits arranged according to another embodiment of the invention. The interior of the PLD comprises a logic array of programmable logic blocks or gates. Surrounding the logic array is a ring of input/output blocks comprising output registers (OUTFFx), output buffers (OBUFx), and output pads (Ox). The output registers are each driven by a programmable clock signal CK and a programmable clock enable signal CE. The output registers are also grouped into two groups, one on the left half of the PLD and one on the right half of the PLD. The clock signal CK and clock enable signal CE for each group are separate. Because the right half of the PLD is a mirror image of the left half, only the output registers on the left half of the PLD are described.

The clock signal CK is provided by a global clock buffer CKBUFL located, in this embodiment, at the top center of the PLD. (In other embodiments, the clock buffer is located at the bottom of the PLD, a corner of the PLD, or in another location.) As with many known global clock distribution networks, the clock signal CK is first routed to the center of the PLD, then distributed globally from that point, to minimize skew. The clock signal CK is distributed to the output registers on an interconnect line running parallel to the edges of the PLD and outside the logic array. A single clock is used for all output registers on the left half of the PLD.

The clock enable signal is provided by a clock enable circuit CE_CKT_L in the center of the left side of the PLD. The clock enable generation circuit CE_CKT_L can be implemented, for example, as shown in FIG. 2. In this embodiment, internal programmable logic signals are also provided by way of general interconnect lines from the logic array to the clock enable circuit CE_CKT_L. From this central location, the clock enable signal PCI_CE_L is distributed to the output registers along the left edge of the PLD, via a vertical interconnect line running parallel to the edge of the PLD and outside the logic array. This vertical interconnect line can be programmably coupled via a programmable interconnect point PIP_UL to a horizontal interconnect line extending to the output registers positioned above the logic array. The vertical interconnect line carrying the PCI_CE_L signal can also be programmably coupled via a programmable interconnect point PIP_LL to a horizontal interconnect line extending to the output registers positioned below the logic array.

The provision of programmable interconnect points (PIPs) between the vertical and horizontal clock enable interconnect lines permits the clock enable signal to be provided only to the output registers located along the left-hand edge of the PLD (OUTFF1–OUTFFn and OUTFF33–OUTFFm in the embodiment of FIG. 3). The output registers along the top edge (OUTFFn+1–OUTFF32) and the bottom edge (OUTFFm+1+–OUTFF64) are optionally decoupled from the clock enable circuit. This feature speeds up the clock enable signal significantly when less than a 64-bit bus is used, by significantly reducing the loading on the signal. The values of n and m vary depending on the number of output registers along the edge of the PLD. In one embodiment, all 64 data output registers are arrayed along the left edge of the PLD. In other embodiments, a maximum data bus width other than 64 is provided, e.g., 128 bits. In one embodiment, 64 data output registers are arrayed along the left edge, with additional registers being supplied along the top and bottom edges of the PLD. In some embodiments, additional logic in the PCI circuit is implemented using other output registers in addition to the address/data bus. For example, in one embodiment 13 additional registers are used. These additional output registers are not shown in FIG. 3, but may be located along any edge of the PLD, preferably in the same half of the PLD.

The central location of the clock enable circuit in the PLD of FIG. 3 is desirable both because it limits the delay from the clock enable circuit to the farthest output registers, and because it minimizes the skew between the closest output registers and the farthest output registers. If this skew becomes too large, it can cause problems for the circuit. For example, if the skew between different registers becomes too large, the clock enable signal edge may not fall within the setup and hold time "window" for all registers. The output registers, as with any other registers, have both setup and hold time requirements. The setup time for the clock enable pin with respect to the clock pin is the amount of time by which the clock enable signal must precede the clock signal in order for the register to respond correctly to the clock. The hold time is the amount of time the clock enable signal must remain at the clock enable pin of the register after the clock signal edge. Therefore, there is a delicate balance wherein the clock enable signal must arrive long enough before—but not too long before—the clock signal. If either of the setup and hold requirements is violated, the PLD output either fails to meet the PCI timing requirements, or simply doesn't function properly (e.g., latches the wrong data). In order to ensure meeting both the setup and hold time requirements, it is common to delay one or the other signal, for example, to delay the clock enable edge so it falls within the proper time period with respect to the clock edge.

A PLD is typically produced in several different sizes, with different sizes of logic arrays and different numbers of input/output pins (and consequently different numbers of output registers). This change in sizing may alter loading and interconnect delays throughout the PLD. Therefore, adjusting the clock enable signal relative to the clock signal can result in a perfectly functioning output register in one device (e.g., a larger device), while creating a non-functional output register in another PLD (e.g., a smaller device).

Figure 4:
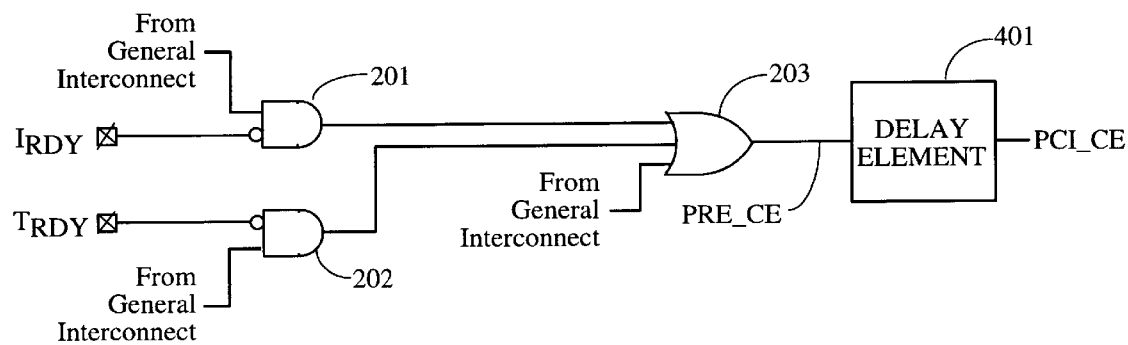
FIG. 4 shows a clock enable circuit according to another embodiment of the invention.

In order to overcome these limitations, one embodiment of the invention includes a programmable delay element in the clock enable circuit, as shown in FIG. 4. Between the OR-gate 203 (described earlier in connection with FIG. 2) providing signal PRE_CE, and the output terminal providing clock enable signal PCI_CE, a delay element 401 is provided. This delay element is preferably programmable, and may be either mask programmable or programmable by the user. If mask programmable, the correct delay for the particular size of PLD can be inserted by the PLD manufacturer, making the whole issue transparent to the user. In another embodiment, the delay element is included as part of OR-gate 205, or otherwise included in the clock enable circuit.

Figure 5:
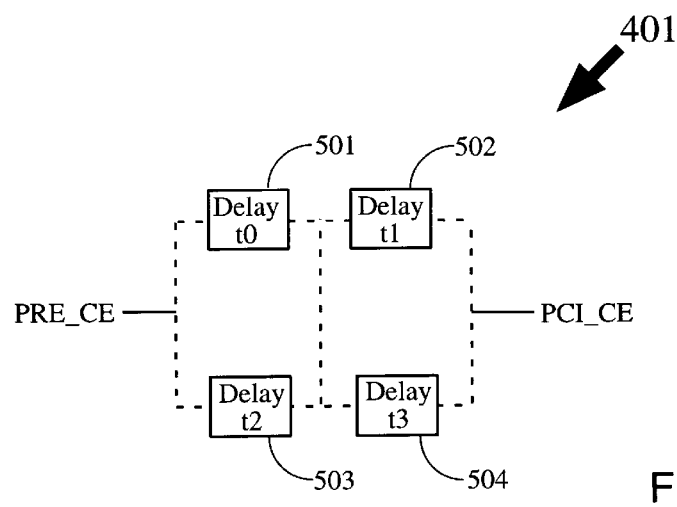
FIG. 5 shows a programmable delay element for the clock enable circuit of FIG. 4.

FIG. 5 shows a mask programmable delay element 401 that can optionally be used in the clock enable circuit of FIG. 4. The dotted lines represent mask programmable interconnect lines. These lines may be provided or omitted at the discretion of the PLD manufacturer. The delay element of FIG. 5 comprises a series of delay elements 501–504. Delay element 501 has a delay of t0 ns; delay element 502 has a delay of t1 ns; delay element 503 has a delay of t2 ns; and delay element 504 has a delay of t3 ns. Any of the following delays can be implemented by appropriately placing the mask programmable interconnect lines.

$t0+t1=0.6$ ns $t2+t1=0.8$ ns $t0+t3=0.9$ ns $t2+t3=1.1$ ns

In other embodiments, the number of delay elements and/or the delays provided are different from those shown here. In another embodiment, delay elements 501–504 are arranged in series, and the output signal PCI_CE can be mask programmably taken from the series of delay elements prior to the first delay element, or after any of the delay elements.

Those having skill in the relevant arts of the invention will now perceive various modifications and additions that may be made as a result of the disclosure herein. For example, communications standards, data bus widths, control signals, logic arrays, output registers, output buffers, and delay elements other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A clock enable circuit in a programmable logic device (PLD) for generating a clock enable signal, comprising:
   a first portion of the circuit implemented using programmable logic gates otherwise usable for other logic functions; and
   a second portion of the circuit comprising at least one critical path for the circuit, the second portion being implemented using non-programmable logic gates not usable for other logic functions,
   whereby the clock enable signal is generated more quickly than in another circuit entirely implemented using programmable logic gates.

2. The clock enable circuit of claim 1, wherein the at least one critical path comprises no more than two levels of logic.

3. The clock enable circuit of claim 1, wherein:
   the clock enable circuit is driven by two external signals $I_{RDY}$ and $T_{RDY}$; and
   the at least one critical path lies between the two external signals and the clock enable signal.

4. The clock enable circuit of claim 3, wherein the second portion of the circuit comprises:

a first AND-gate driven by the external signal $I_{RDY}$;
a second AND-gate driven by the external signal $T_{RDY}$; and
an OR-gate driven by the first and second AND-gates and providing the clock enable signal.

5. The clock enable circuit of claim 1, further comprising a programmable delay element.

6. The clock enable circuit of claim 5, wherein the programmable delay element is mask programmable.

7. A method of generating a clock enable signal in a programmable logic device (PLD), comprising:
   implementing a first portion of the circuit using programmable logic gates otherwise usable for other logic functions; and
   implementing a second portion of the circuit using non-programmable logic gates not usable for other logic functions, the second portion comprising at least one critical path for the circuit,
   whereby the clock enable signal is generated more quickly than in another circuit entirely implemented using programmable logic gates.

8. The method of claim 7, wherein the at least one critical path comprises no more than two levels of logic.

9. The method of claim 7, wherein:
   the clock enable circuit is driven by two external signals $I_{RDY}$ and $T_{RDY}$; and
   the at least one critical path lies between the two external signals and the clock enable signal.

10. The method of claim 9, wherein the second portion of the circuit comprises:
    a first AND-gate driven by the external signal $I_{RDY}$;
    a second AND-gate driven by the external signal $T_{RDY}$; and
    an OR-gate driven by the first and second AND-gates and providing the clock enable signal.

11. The method of claim 7, further comprising providing a programmable delay element as part of the second portion of the circuit.

12. The clock enable circuit of claim 11, wherein the programmable delay element is mask programmable.

13. A programmable logic device (PLD), comprising:
    a programmable logic array; and
    a ring of input/output blocks placed around the array of programmable logic blocks, the ring of input/output blocks comprising:
       a first plurality of output registers located along a first edge of the array;
       a second plurality of output registers located along a second edge of the array, the second edge being adjacent to the first edge;
       a third plurality of output registers located along a third edge of the array, the third edge being adjacent to the first edge and opposite to the second edge;
       a first clock enable circuit generating a first clock enable signal, the first clock enable circuit comprising non-programmable logic gates not usable for other logic functions, the logic gates comprising at least one critical path for the clock enable circuit, the logic gates being located near the center of the first edge;
       means for supplying the first clock enable signal to the first plurality of output registers;
       programmable means for supplying the first clock enable signal to the second plurality of output registers; and programmable means for supplying the first clock enable signal to the third plurality of output registers.

14. The PLD of claim 13, further comprising additional clock enable logic implemented within the programmable logic array.

15. The PLD of claim 13, wherein the programmable means for supplying the first clock enable signal to the second plurality of output registers and the programmable means for supplying the first clock enable signal to the third plurality of output registers comprise programmable interconnection points (PIPs).

16. The PLD of claim 13, wherein the logic gates comprise a critical path for the first clock enable circuit.

17. The PLD of claim 13, wherein the logic gates comprise no more than two levels of logic.

18. The PLD of claim 13, wherein:

the logic gates are driven by two external signals $I_{RDY}$ and $T_{RDY}$; and two critical paths for the first clock enable circuit lie between the two external signals and the first clock enable signal.

19. The PLD of claim 18, wherein the logic gates comprise:

a first AND-gate driven by the external signal $I_{RDY}$;

a second AND-gate driven by the external signal $T_{RDY}$; and an OR-gate driven by the first and second AND-gates and providing the first clock enable signal.

20. The PLD of claim 13, further comprising:

a fourth plurality of output registers located along a fourth edge of the array, the fourth edge being opposite to the first edge;

a fifth plurality of output registers located along the second edge of the array;

a sixth plurality of output registers located along the third edge of the array;

a second clock enable circuit generating a second clock enable signal, the second clock enable circuit comprising non-programmable logic gates not usable for other logic functions, the logic gates comprising at least one critical path for the clock enable circuit, the logic gates being located near the center of the fourth edge;

means for supplying the second clock enable signal to the fourth plurality of output registers;

programmable means for supplying the second clock enable signal to the fifth plurality of output registers; and programmable means for supplying the second clock enable signal to the sixth plurality of output registers.

21. The PLD of claim 13, wherein the first clock enable circuit further comprises a programmable delay element.

22. The PLD of claim 21, wherein the programmable delay element is mask programmable.

* * * * *